United States Patent [19]
Van Riezen

[11] Patent Number: 5,208,548
[45] Date of Patent: May 4, 1993

[54] PROGRAMMABLE CONTROLS FOR VACUUM TUBE PREAMPLIFIER

[75] Inventor: Daniel A. Van Riezen, Novato, Calif.

[73] Assignee: Randall C. Smith, Petaluma, Calif.

[21] Appl. No.: 880,740

[22] Filed: May 8, 1992

[51] Int. Cl.$^5$ .................. H03F 17/00; H03G 3/08
[52] U.S. Cl. ............................ 330/59; 381/118; 381/109
[58] Field of Search ............... 330/59, 129, 141, 281, 330/284; 381/101, 102, 107, 108, 109, 118, 120, 121

[56] References Cited
U.S. PATENT DOCUMENTS 5,001,440  3/1991  Zerod .............................. 330/284
5,032,796  7/1991  Tiers et al. .................... 381/118 X Primary Examiner—Steven Mottola
Attorney, Agent, or Firm—James E. Eakin

[57] ABSTRACT

Light Dependent Resistors (LDR's) are used together with a differential amplifier and a plurality of reference resistors to replace conventional analog potentiometer controls and thus offer digital activation and programmability to a traditional style vacuum tube preamplifier.

3 Claims, 3 Drawing Sheets

PROGRAMMABLE CONTROLS FOR VACUUM TUBE PREAMPLIFIER

FIELD OF THE INVENTION

The present invention relates to electronic amplifiers for musical instruments, particularly guitar, as well as to electronic amplifiers for playback or processing of recorded musical media.

BACKGROUND AND SUMMARY OF THE INVENTION

For all the public perception that today's musicians embrace or pioneer the latest in tastes and fashions, the electric guitarists among them are surprisingly conservative and overwhelmingly traditional when it comes to their musical instruments. To the unaware, this would seem particularly odd because electric guitarists are commonly viewed as the most radical breed of rebel in a modern band of stylistic outlaws. But where else in the 1990's could be found such traditionalist xenophobes that the two perennial best selling guitars both originated in the 1950's and the only type of electronic amplification technology that rates serious consideration is based on the vacuum tube!

Nowhere else does the tube vs. transistor rivalry still so overwhelmingly come down in favor of the antique, and for several compelling reasons. First, the traditionalist argument again: The original sounds of electric guitar were created through vacuum tube amplifiers and hence, in the view of many, "the sound was thus defined". And as guitar sounds have evolved since, an ever more important element has become the intentional use of massive saturation distortion of overdriven vacuum tubes. While many designers have sought solid state parity to the performance of vacuum tubes in guitar amplifiers, even the best of them have enjoyed only marginal success.

Modern transistor and digital electronics have, of course, totally displaced the vacuum tube in recording studios and in keyboard instruments and several of the modern wonders of this technology are potentially appealing to the guitarist. What the guitar player would most like is an amplifier with self-explanatory controls, capable of producing the entire palette of traditional and modern amplified guitar sounds with perfect authenticity, whose settings could also be easily stored in a digital memory and recalled instantly via a foot-operated controller. Indeed, a few programmable preamplifiers for guitar have been introduced and have enjoyed some success commercially.

But the central element distinguishing a musical instrument from a piece of commercial electronic gear is its longevity. And just as keyboard synthesizers and signal effect processors have notoriously short product lifespans, such has also been the fate of the first programmable preamplifiers for guitar. Some of these even managed to accommodate a tube or two in their signal chain but to no lasting avail. Eventually the newness of programmability wears thin and the amplifier is heard for its essential sound and found lacking.

In the prior art, no one has been able to successfully replicate digitally the traditional analog tone control/volume control network whose particular interplay is absolutely crucial to delivering the essential characteristics of sound quality and controllability that guitarists demand.

As a point of history, the now traditional tone control circuit (illustrated schematically in FIG. 1) was first introduced in the mid 1950's by the Fender Musical Instrument Company of Fullerton, Calif. and is found with only minor alterations in all of the most successful amplifiers since. It is now safe to say that this is the tone/volume control circuit whose particular sound and functionality—though technically flawed by interaction between its various controls—is nonetheless musically "perfect" because it became the standard by which other devices were judged, in part perhaps because of the complex interaction of these components. Any design which deviates from this standard has so far found its lifespan short, particularly among discriminating, trend setting players. Many guitarists feel like they've "come home" when they return to this traditional set up after a period on some other type of tone control.

Yet however simple this circuit is to achieve with analog potentiometers, its replication into a format allowing simple digital control has, in the prior art, largely defied the best efforts of previous design talents.

The prior art has attempted to approximate the tone/volume network with fixed high- and low-pass filters (for treble and bass) working in conjunction with voltage control amplifiers (VCA's), which readily lend themselves to digital control. Unfortunately this approach has intrinsic limitations: VCA's typically operate on $+15$ and $-15$ volt supplies and thus cannot handle the high signal voltage produced at the output of a vacuum tube voltage amplifier. So in some prior art the VCA's are located prior to the tube amplifying stages—resulting in unacceptably high noise levels, particularly when massive "Lead Mode" saturation gain is introduced later in the circuit. The alternative solution is to insert an attenuation pad between the tube voltage amplifiers and the VCA's but this approach introduces its own new set of audio characteristics which further confounds the central problem of the entire VCA approach. That central problem is that it fails to faithfully execute the functions of the traditional analog system, in which complex interplay among the elements is a vital ingredient of the overall performance.

Another example of prior art grappling with this problem and at least recognizing the absolute importance of including the traditional tone/volume network has resulted in a handful of units being built with digitally controlled stepper motors twisting actual potentiometers! This design at least has the virtues of faithful sonic performance and extreme ease of operation. Unfortunately, the price and complexity make it more a curiosity than a practical unit. Additionally, even though the traditional circuit is there, programmability is limited to various settings of the same controls; other control values and parameters could not easily be substituted.

There has therefore been a need for a programmable, digitally controlled volume control for vacuum tube amplifiers. The present invention substantially overcomes the limitations of the prior art in that it provides a readily adjustable, simple to use, programmable digital volume control capable of working with the high voltages generated by vacuum tube amplifiers, and operable through a foot controller.

In a key aspect of the invention, all of the circuit elements of the tone control of the current invention remain faithful to the traditional set up with the exception of the variable resistance devices which replace the original analog potentiometers.

Because neither FET nor bipolar transistors are suitable for the very high signal voltages present in the control circuitry (especially with massive saturation distortion), another control device was necessary for replacement of the standard potentiometer.

Light Dependent Resistors (LDR's), which are well known and commonly used in guitar amplifiers to provide low-noise analog signal switching, offered some attractive features. The LDR consists of an LED and a photo-sensitive cadmium-sulfite resistance element facing each other on a light tight package. The "off resistance" of the photo cell is very high, typically 200 megohms or so, while the "on resistance" (depending on the type of device) can be as low as 100 ohms. The virtue of this device as an analog switch in high gain audio amplifiers is that its rapid swing in resistance (from off to on, or back again) precludes the transient "pop" endemic to instantaneous relay switching.

However, to replace the standard potentiometer requires that the device be capable of being used as a stable, repeatable, variable resistor, and the conventional LDR, taken alone, is not because controlling the LDR in its "resistance region" between the conditions of "off" and substantially "on" is very difficult for several reasons. First, cell resistance as a function of LED current (brightness) is extremely nonlinear, falling rapidly from "off" to around 40k ohms just as soon as the LED begins to illuminate and draw current. Second, cell resistance is wildly unstable, differing grossly from one device to another, rising dramatically as temperature is increased, and even changing over time (all other factors remaining stable) as the cell material becomes "light adapted". Thus, while the LDR provides the enticing characteristics of high signal voltage capability plus a potential for resistance variability to one megohm or higher, it presented very difficult problems if it is to be used as stable, repeatable, variable resistor—particularly in the high resistance region required, namely 250k ohms to 1 megohm.

As a result, conventional prior art circuits for use of LDR's were deemed unacceptable for the present application.

In order to achieve high resistance values in the system, the present invention provides an LDR device together with a negative feedback loop around a differential amplifier wherein the feedback loop incorporates a capacitor, such that the resulting RC time constant has the effect of lowering the gain in the time domain such that the action of the differential amplifier driving the LED portion of an LDR compensates for, and synchronizes with, the time lag inherent in the photo sensitive cell's delayed response to changing light conditions. This has the desired effect of creating a substantially steady resistance over a wide range of high resistance values whereas in the prior art the result would be a continually varying cell resistance as the LED portion of the LDR illuminates too brightly at first (overcompensating for the very high "off" resistance of the cell) and then stays illuminated for too long due to the time lag of the cell's delayed response to light, then turns off as resistance swings too low, causing reverse drive from the differential amplifier.

A resistor ladder, comprising a plurality of discrete resistors, provides a reference wherein each of such resistors represents a desirable discrete incremental setting of the equivalent analog control in the traditional circuit. In this manner repeatability and programmability is provided while retaining all of the fundamental circuitry of the traditional tone control circuit.

A general object of the present invention is to provide a digitally operated set of programmable controls which accurately duplicates the traditional analog set of volume and tone controls for a vacuum tube guitar preamplifier.

A specific object of the present invention is to utilize Light Dependent Resistors (LDR's) as the functional variable resistance elements in substitution for the analog potentiometers used in the traditional volume/tone control circuitry.

A further specific object of the present invention is to insure stability and accurate repeatability of setting for the LDR devices under varying conditions of age and temperature as well as from one production batch of devices to another.

Another specific object of the present invention is to achieve high value resistance from an LDR's photo cell by causing the LED in the LDR to blink on and off rapidly as controlled by a servo loop fed by a differential amplifier and referenced to any one of a plurality of fixed resistors, each one of which represents a desirable discrete incremental setting of the equivalent analog control in the traditional circuit.

Yet another specific object of the present invention is that the reference resistors controlling the servo loop/differential pair as described above, will each have a value equal to (or proportional to) the value which the LDR reference cell will become, as controlled by the active cell segment which therefore replicates a similar specific discrete setting of the analog potentiometer which it represents and is therefore equivalent to.

A still further specific object of the present invention is to include in the differential amplifier described above, a negative feedback path such that overall gain in the servo loop/differential pair is reduced to a point in accordance with the lag time of the photo cell's response to—and recovery from, the blinking LED such that stable high resistance results and the "noise" of the rapidly changing cell resistance is thereby reduced or eliminated as stable resistance is achieved.

Yet another object of the present invention is to couple together two such circuits as described above so that the pair of differential amplifiers (each one driving the LED of that pair's LDR) both derive their reference from any single point along a series of fixed reference resistors, where each point represents a desirable discrete incremental setting of the equivalent traditional circuit—and further, that the pair of LDR active cell segments are connected in series to each other in an arrangement analogous to a potentiometer type variable attenuator i.e. a constant overall fixed resistance such that any pair of series and shunt resistance values taken together always adds up to the total fixed resistance value.

These and other objects, advantages and features of the present invention will become apparent to those skilled in the art upon consideration of the following detailed description of two preferred embodiments, presented in conjunction with the accompanying drawings:

DETAILED DESCRIPTION OF THE INVENTION

Figure 1:
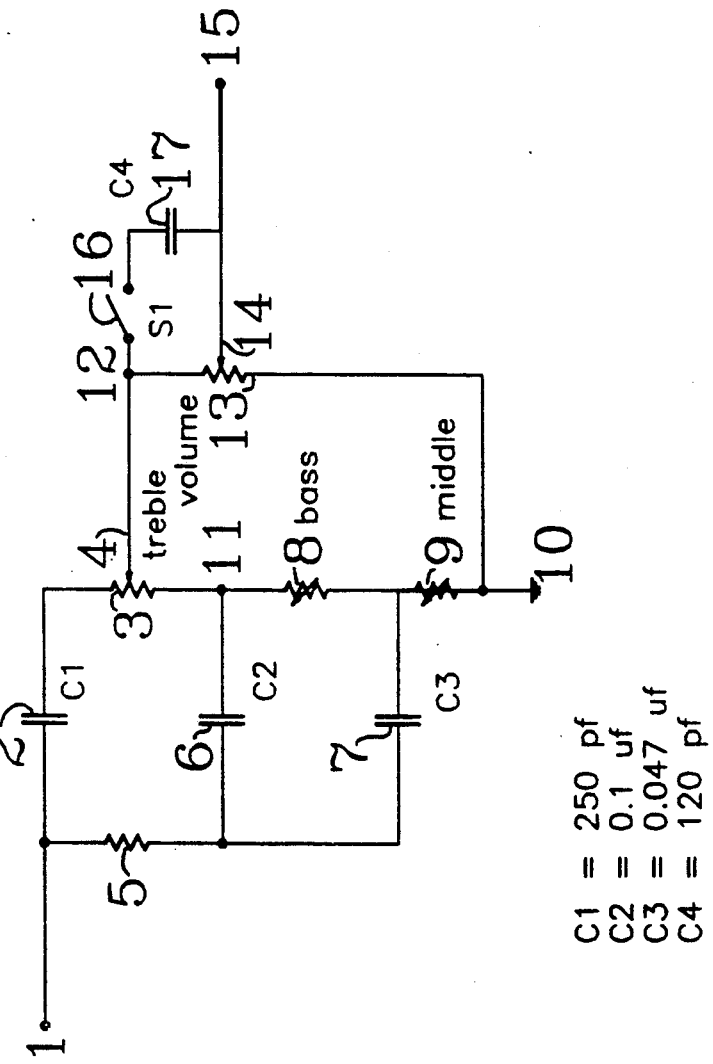
FIG. 1 is a schematic diagram—included for reference purposes—of the traditional set of prior art tone controls followed by a volume control as used between stages in a guitar amplifier.

With reference to FIG. 1, a traditional guitar amplifier tone control circuit of the type introduced in the mid 1950's by the Fender Electric Instrument Company includes an input terminal 1 where electronic signal voltages are applied from either the plate or the cathode of the preceding stage. Signal is coupled through a small value capacitor 2 (250 pf) (traditional values are shown in parentheses) to the top end 3 of Treble control variable attenuator (250 k ohm) whose adjustable wiper element 4 provides the output of the entire tone control network. Signal is also coupled from the input terminal 1 through fixed resistor 5 (100 k ohm) to a pair of capacitors 6 (0.1 uf) and 7 (0.047 uf) which operate as low pass filter elements in conjunction with variable resistors 8 (250 k ohm) and 9 (10 k ohm) which function respectively as Bass and Middle tone controls by adjustably shunting their respective frequency bands to ground 10 or enabling these frequencies to appear in varying strengths and proportions at the lower end 11 of the Treble tone control. The position of the Treble control wiper 4 further determines the balance of treble vs. combined bass and mid frequencies that are outputted from the tone control circuit and coupled to the input end 12 of the Volume control variable attenuator (1 megohm) whose shunt end 13 is connected to ground 10 and whose variable wiper element 14 provides the output of the combined tone/volume circuit as shown at output terminal 15. A Bright switch 16 activates a high pass capacitor 17 (120 pf) providing an alternate path for boosting high frequencies around the resistance 12, 14.

Figure 2:
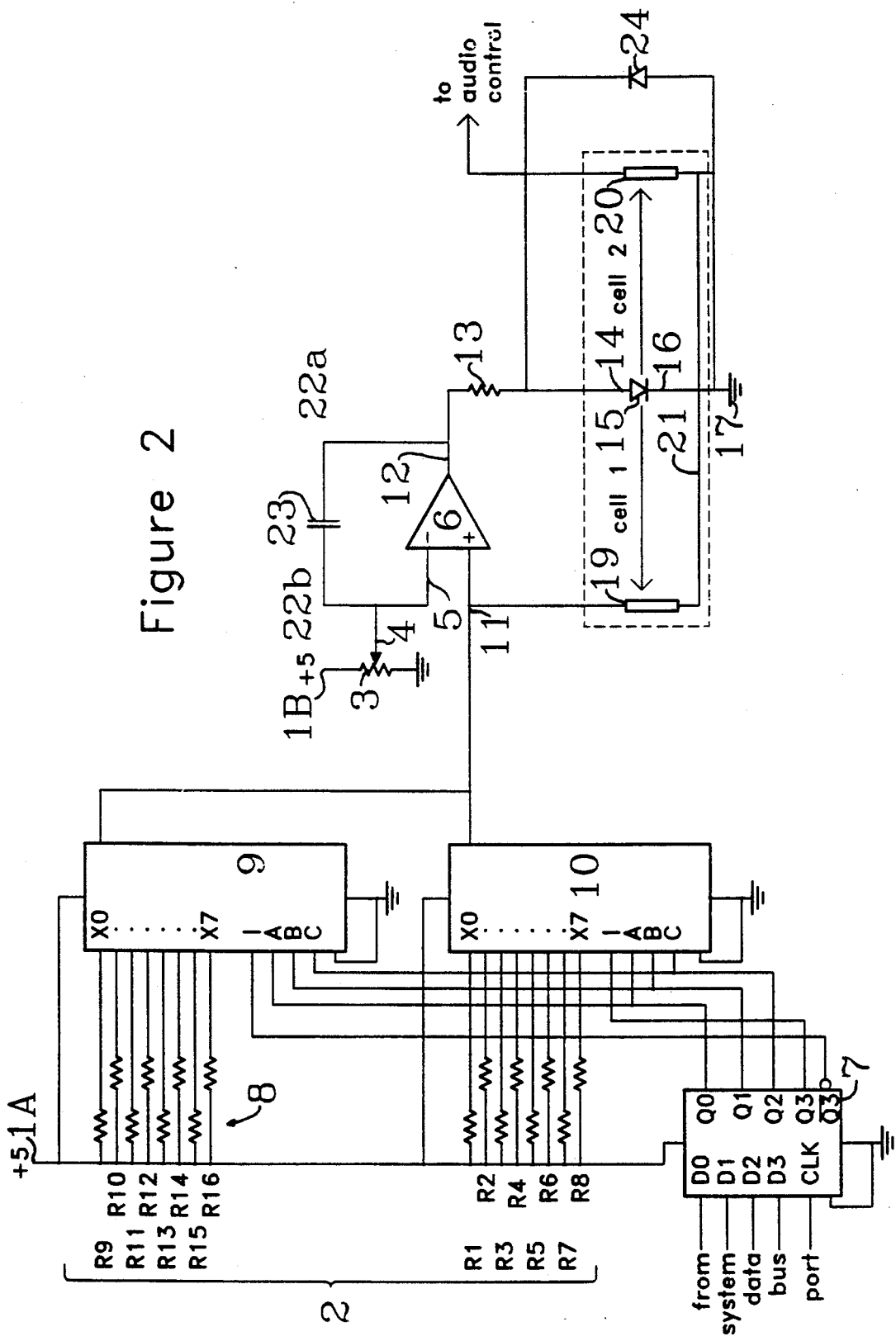
FIG. 2 is a schematic diagram of a preferred embodiment of the present invention which illustrates a single center-tapped LDR arranged as a simple variable resistance and include means for stabilizing the LDR plus means for enabling accurate repeatability of setting for the LDR.

With reference to FIG. 2, a preferred embodiment of the present invention is shown. A 5 volt supply shown at 1A feeds one end of the reference resistor ladder 2 while the same 5 volt supply shown at 1B supplies an adjustable trim pot 3. The trim pot 3 is nominally adjusted to provide a reference 2.5 volts (one half of a supply) at its adjustable element 4 which is coupled to the inverting terminal 5 of an operational amplifier 6 configured as a differential amplifier. Further minor adjustments of the trim pot 3 can be made to compensate for manufacturing inaccuracies in locating the center tap connection 21 so that the two cell segments 19 and 20 may become more precisely equal in resistance. A four-bit latch 7 (which receives data from a system data bus, not shown) selects any one of the fixed reference resistors of the ladder 3, say for example R13, 8, which is coupled via a one-of-eight analog switch 9 (to of which are provided 9 and 10 giving a total resolution of sixteen increments) such that supply voltage from 1A flows through the selected resistor 8 and is conducted to the non-inverting terminal 11 of the differential operational amplifier 6. Voltage from the output 12 of the differential amplifier 6 is coupled through a current limiting resistor 13 to the anode 14 of the LED 15 whose cathode 16 is connected to ground 17. This LED 15 is the light emitting element of a Light Dependent Resistor (LDR) 18 which contains a center-tapped photo sensitive cell shown as two variable resistors 19 and 20 connected together by a conductor 21 which is connected to ground 17.

In a center tapped LDR cell, it may be assumed that the two halves of the resistance 19 and 20 will always be substantially the same resistance value as they are both exposed to the same single light source 15 and both are one and the same piece of photo sensitive material which merely has a conductor lead 21 connected at its mid point. Other factors such as age, temperature and degree of "light adaptation" will also remain substantially identical for the two halves of a center tapped LDR cell.

Therefore, the overall action of the differential amplifier 6 will be to drive the LDR's LED 15 until the reference half 19 of the cell achieves a resistance exactly equal to that of the selected fixed reference resistor 13, such that one-half of supply (2.5 volts) is then applied to the non-inverting terminal 11. Then—and only then—will the voltages applied to both inverting input 5 and non-inverting input 11 of the differential amplifier 6 be equal: the inverting terminal 5 receiving one half of the supply (2.5 volts) as set by the trim pot 3, while the non-inverting input 11 receives one half of the supply from the mid-point of the two now equal value resistors in series, one being the selected fixed reference resistor 8 and the other being the variable reference resistor cell segment 19 as controlled by the differential operation of the amplifier 6. Further, the continuing differential action will simultaneously correct any drift in the resistance of the reference half 19 of the cell and thereby compensate for the effects of temperature variation, "light adaptation" changes as well as deviation from one device to another in production.

Because the "active" (or audio) half 20 of the center tapped variable light dependent resistance cell will be equal in value to the reference half 19 of the cell, the resistance values at 20 and 19 will both be the same and each be equal to the selected fixed reference resistance 8 selected from the fixed reference resistor ladder 3 by the digitally controlled network. Those skilled in the at will understand that this differential/servo control circuit works to provide equal ratios in the two control and reference resistance dividers 3, 4 and 8, 19 respectively and that the condition of "one half" of the supply was chosen merely as a convenience; any other setting of the control divider 3, 4 would produce a corresponding ratio of resistance values in the reference divider 8, 19.

In order to achieve high resistance values in the system, a negative feedback loop 22 around the differential amplifier 6 incorporates a capacitor 23 which, together with the associated resistance, provides a time constant which has the effect of "lowering the gain in the time domain"—lengthening the response time through the loop—such that the action of the differential amplifier 6 driving the LDR's LED 15 compensates for—and synchronizes with, the time lag inherent in the photo sensitive cell's delayed response to changing light conditions. This has the desired effect of creating a substantially steady resistance over a wide range of high resistance values where otherwise the result would be a continually varying cell resistance as the LED 15 illuminates too brightly at first (overcompensating for the very high "off" resistance of the cell 19) then—due to the time lag of the cell's 19 delayed response to light—stays illuminated for too long, then turns off (and is actually "driven in the reverse direction" by the action of the differential amplifier 6) as the "light adapting" cell material now swings to too low a resistance condition, then begins again to swing excessively high in resistance toward its "off" condition which causes the differential amplifier to again over drive the LED 15 . . . and so on, resulting in an oscillation of the circuit which produces virtual noise at the active cell 20 instead of the desired stable high value resistance.

Diode 24 is placed across LED 15 to protect it (15) from reverse overvoltage as the action of the differential amplifier 6 tries to compensate for a resistance in the variable reference cell 19 that has risen above that of the fixed reference resistor 13.

Figure 3:
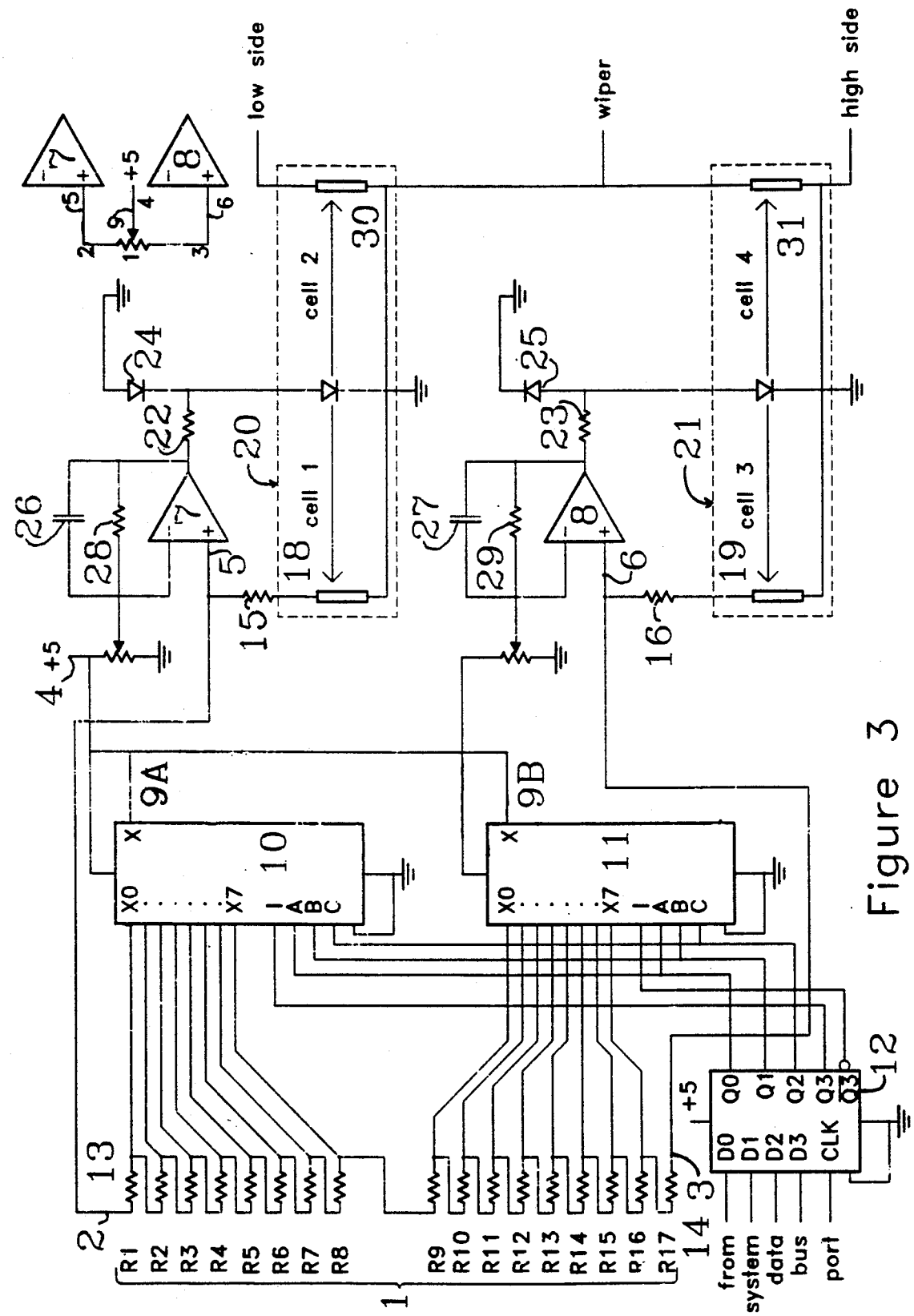
FIG. 3 is a schematic diagram of a preferred embodiment of the present invention which illustrates a pair of dual-cell LDR's arranged as an adjustable attenuator with both series and shunt elements adjustable while maintaining a uniform total resistance across the combined resistance network.

With reference now to FIG. 3, a pair of dual cell LDR's 20, 21 are arranged in a like manner to that described under FIG. 2, including—for each—the use of servo loop and differential amplifier with negative feedback. However, in the circuit application of FIG. 3 the two "active" or audio cells 30, 31 are shown tied together in series to form the equivalent of an adjustable attenuator whose adjustable wiper element (being the common connection between the two cells) is positioned at any of sixteen discrete increments along the total combined cell resistance as determined by the chosen insertion position of the 5 volt supply 4 along the reference string 1 of seventeen fixed resistors connected in series. A more specific description follows.

To aid in understanding this arrangement, reference is made to that section of FIG. 3 entitled "Series Reference Resistor String, Simplified." What is shown here as a single resistor 1, in actuality a string of seventeen fixed reference resistors connected in series as shown in the detailed portion of FIG. 3 as R1, R2, etc. through R 17. In both the simplified and the detailed drawings of FIG. 3 each of the opposite ends 2, 3 of the reference resistor string 1, is connected to the non-inverting input 5, 6 of a separate differential amplifier 7, 8. The simplified drawing shows the five volt supply 4 being connected to some selectable point along the resistor 1 by contact point 9. In the detailed drawing this is accomplished when any one position of either one of the two one-of-eight analog switches 10, 11 is selected by the 4-bit latch 12 as instructed by the system data bus (not shown). Thus, five volts from supply 4 flows to any one of sixteen points between the seventeen resistors R1–R17 and is distributed to the non-inverting terminals 5, 6 of the differential amplifiers 7, 8 in exact proportion as determined by the combination of total series resistance between supply 4 and the ends 2, 3 of the series reference resistor string.

Each end 2, 3 of the series reference resistor string employs a 5.6 k ohm resistor R1, R17 as a minimum to prevent the supply 4 from overdriving one or the other non-inverting inputs 5, 6 of the two differential amplifier 7, 8 when the most extreme positions are selected at either end of the resistance string, for example a point 13 between R1, R17 representing the uppermost end 3 of the series resistor reference string 1, R1–R17. An off-setting pair of equal value resistors 15, 16 are placed between the variable reference photo cells 18, 19 of each dual-cell LDR 20, 21 and the respective non-inverting terminal 5, 6 of the associated differential amplifier 7, 8.

Circuit function is virtually identical to that described under FIG. 2, (except in FIG. 3 there are a pair of servo/differential/LDR circuits) including the use of a pair of current limiting resistors 22, 23, and a pair of reverse overvoltage protection diodes 24 and 25. Negative feedback is again utilized around each differential amplifier to accommodate the photocell's time lag in responding to changing light conditions form a flashing LED. In the circuit of FIG. 3 a very high resistance value, digitally controllable potentiometer is shown—one with a 250 KOhm overall resistance—and suitable for use as the Treble control 3 of the traditional analog circuit as illustrated schematically in FIG. 1. In order to allow a more rapid swing of the dual LDR based digitally controlled adjustable attenuator across wide ranges of resistance value, the time constant of the capacitors 26 and 27 in the feedback loops of their respective differential amplifiers 7, 8 has ben altered by the inclusion of resistors 28 and 29 respectively. Thus the overall resistance of the digitally controllable variable attenuator comprising the two series-connected active photo cells 30, 31 is established by the total combined resistance in the reference string 1. The position of the selectable active wiper element along the fixed total resistance is determined by the specific insertion point of the 5 volt reference supply voltage along the series reference resistance string 1.

Having fully described one embodiment of the present invention, it will be apparent to those of ordinary skill in the art that numerous alternatives and equivalents exist which do not depart from the invention set forth above. It is therefore to be understood that the invention is not to be limited by the foregoing description, but only by the appended claims.

What is claimed is:

1. A circuit for replacing an analog variable resistor in an audio amplifier comprising
   a Light Dependent Resistor divided by a center-tap into a first "reference" segment and a second "active" segment both illuminated by a Light Emitting Diode;
   a differential amplifier circuit including a negative feedback path with a time constant;
   a first, substantially fixed voltage divider sourced from reference supply voltage and shunted to ground;
   a second selectable reference voltage divider sourced from reference supply and shunted to ground wherein the series element of said reference voltage divider comprises a selectable fixed resistance value and wherein the shunt element of said reference voltage divider consists of said LDR reference segment configured such that:
   output from said second selectable reference voltage divider is applied to the non-inverting terminal of said differential amplifier,
   output from said first fixed voltage divider is applied in conjunction with negative feedback to the inverting terminal of said differential amplifier, and
   output from the differential amplifier—representing any difference between the ratios of values in said first and second voltage dividers—is applied to said feedback path and to said Light Emitting Diode such that stable, selectable high resistance values in said active segment are obtainable.

2. A circuit for replacing an analog variable resistor in an audio amplifier comprising a dual cell Light Dependent Resistor with a first "reference" cell and a second "active" cell, both illuminated by a Light Emitting Diode;

a differential amplifier circuit including a time-constant negative feedback path;

a first, substantially fixed voltage divider sourced from reference supply voltage and shunted to ground;

a second selectable reference voltage divider sourced from reference supply and shunted to ground wherein the series element of said reference voltage divider comprises a selectable fixed resistance value and wherein the shunt element of said reference voltage divider consists of said LDR reference segment configured such that:

output from said second selectable reference voltage divider is applied to the non-inverting terminal of said differential amplifier, output from said first fixed voltage divider is applied in conjunction with negative feedback from said differential amplifier to the inverting terminal of said differential amplifier, and output from the differential amplifier—representing any difference between the ratios of values in said first and second voltage dividers—is applied to said feedback path and to said Light Emitting Diode such that stable, selectable high resistance values in said active segment are obtainable.

3. A circuit for replacing an analog variable attenuator in an audio amplifier comprising a pair of dual-cell Light Dependent Resistors each with a first "reference" cell and each with a second "active" cell, wherein both active cells are connected to each other in series and both cells of a given LDR are illuminated by a Light Emitting Diode;

a pair of differential amplifier circuits each including a time-constant negative feedback path;

a first pair of substantially fixed voltage dividers each sourced from reference supply and each shunted to ground;

a second pair of selectable reference voltage dividers each sourced from reference supply and each shunted to ground, wherein the series element of each reference divider comprises the opposite end of a single series reference resistor string sourced to reference supply at selectable common point along said series reference resistor string and, where further, the shunt element of each of said second pair of selectable reference dividers comprises one and the other of said LDR reference cells configured such that:

output from each end of said second selectable reference voltage divider is applied individually to the non-inverting terminal of one and the other differential amplifiers, output from said first pair of fixed voltage dividers is applied individually to the inverting terminal of one and the other differential amplifiers in conjunction with feedback from the output of the given differential amplifier, and output from each of the pair of said differential amplifiers—representing any difference between the ratios of values in said first and second voltage dividers as applied to a given differential amplifier—is applied to said respective feedback path and to said respective Light Emitting Diode such that stable, selectable high resistance values in each of said series connected active cells are obtainable and wherein the sum of the individual resistances in the pair of active cells will remain substantially the same over the range of values for the individual cells.

* * * * *